(12) United States Patent
Lee et al.

(10) Patent No.: US 9,899,093 B2
(45) Date of Patent: Feb. 20, 2018

(54) SEMICONDUCTOR MEMORY DEVICE HAVING MEMORY STRINGS COUPLED TO BIT LINES AND OPERATING METHOD THEREOF

(71) Applicant: SK hynix Inc., Gyeonggi-do (KR)

(72) Inventors: Jong Won Lee, Gyeonggi-do (KR); Jin Su Park, Gyeonggi-do (KR); Hyun Su Woo, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/290,625

(22) Filed: Oct. 11, 2016

(65) Prior Publication Data

US 2017/0337973 A1    Nov. 23, 2017

(30) Foreign Application Priority Data

May 17, 2016    (KR) .......................... 10-2016-0060329

(51) Int. Cl.
*G11C 16/04* (2006.01)
*G11C 16/20* (2006.01)
*G11C 16/34* (2006.01)
*G11C 16/08* (2006.01)
*G11C 16/26* (2006.01)

(52) U.S. Cl.
CPC .......... *G11C 16/20* (2013.01); *G11C 16/0483* (2013.01); *G11C 16/08* (2013.01); *G11C 16/26* (2013.01); *G11C 16/3459* (2013.01)

(58) Field of Classification Search
CPC ..... G11C 16/20; G11C 16/0483; G11C 16/08; G11C 16/26; G11C 16/3459

USPC ........... 365/185.12, 185.22, 185.14, 185.28, 365/185.17

See application file for complete search history.

(56) References Cited

U.S. PATENT DOCUMENTS

| 9,330,780 B1* | 5/2016 | Lee ..................... G11C 16/3454 |
| 2005/0146981 A1* | 7/2005 | Ahn ..................... G11C 29/003 365/189.05 |
| 2009/0067248 A1* | 3/2009 | Lee ..................... G11C 16/0483 365/185.18 |
| 2015/0009758 A1* | 1/2015 | Jang ..................... G11C 16/24 365/185.17 |
| 2016/0099063 A1* | 4/2016 | Shim ..................... G11C 16/14 365/185.19 |

FOREIGN PATENT DOCUMENTS

| KR | 1020090101227 | 9/2009 |
| KR | 1020130087857 | 8/2013 |
| KR | 1020150010134 | 1/2015 |

* cited by examiner

*Primary Examiner* — Connie Yoha
(74) *Attorney, Agent, or Firm* — IP & T Group LLP

(57) ABSTRACT

There are provided a semiconductor memory device and an operating method thereof. A semiconductor memory device includes a memory cell array including a plurality of memory blocks, a peripheral circuit for performing a program operation on a selected memory block among the plurality of memory blocks, and a control logic for controlling the peripheral circuit to perform the program operation. The control logic controls the peripheral circuit to perform a verify operation during the program operation and then apply a pre-drain select line voltage to drain select lines of the selected memory block and unselected memory blocks.

20 Claims, 10 Drawing Sheets

SEMICONDUCTOR MEMORY DEVICE HAVING MEMORY STRINGS COUPLED TO BIT LINES AND OPERATING METHOD THEREOF

CROSS-REFERENCE TO RELATED APPLICATION

The present application claims priority under 35 U.S.C. § 119(a) to Korean patent Application No. 10-2016-0060329, filed on May 17, 2016, which is incorporated herein by reference in its entirety.

BACKGROUND

1. Field

An aspect of the present disclosure relates generally to an electronic device and, more particularly, to a semiconductor memory device and an operating method thereof.

2. Description of the Related Art

Generally, semiconductor memory devices are classified into volatile memory devices and nonvolatile memory devices.

Nonvolatile memory devices perform a read/write operation at a relatively lower speed compared to volatile memory devices, however, unlike volatile memory devices, nonvolatile memory devices retain stored data even when a power supply is cut off. Accordingly, nonvolatile memory devices are typically used for storing data that need to be retained regardless of the status of the power supply. Examples of nonvolatile memory devices are a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), and the like. Flash memories are widely used and may be classified into NOR flash and NAND flash memories.

The flash memories combine have an advantage of a RAM in that data is freely programmed and erased, and an advantage of a ROM in that stored data is retained even when a power supply is cut off. Flash memories are widely used as a storage medium of portable electronic devices such as a digital camera, a personal digital assistant (PDA), and an MP3 player.

A flash memory may be a two-dimensional semiconductor device having a string of cells horizontally formed on a semiconductor substrate or a three-dimensional semiconductor device having a string of cells vertically formed on a semiconductor substrate.

Three-dimensional semiconductor devices were devised to overcome the limit of the degree of integration of two-dimensional semiconductor devices by employing a plurality of memory strings vertically formed on a semiconductor substrate. The memory strings include a drain select transistor, a plurality of memory cells, and a source select transistor, all coupled in series between a bit line and a source line.

SUMMARY

Embodiments of the present invention provide a semiconductor memory device and an operating method thereof, which can prevent a program disturbance phenomenon occurring in unselected memory strings in a program operation of the semiconductor memory device.

According to an aspect of the present disclosure, there is provided a semiconductor memory device including: a memory cell array including a plurality of memory blocks; a peripheral circuit configured to perform a program operation on a selected memory block among the plurality of memory blocks; and a control logic configured to control the peripheral circuit to perform the program operation, wherein the control logic controls the peripheral circuit to perform a verify operation during the program operation and then apply a pre-drain select line voltage to drain select lines of the selected memory block and unselected memory blocks.

According to an aspect of the present disclosure, there is provided a method of operating a semiconductor memory device, the method including: applying a program voltage to word lines of a selected memory block among a plurality of memory blocks included in a memory cell array; performing a verify operation by applying a verify voltage to the plurality of memory blocks; and after the verify voltage is discharged, applying a pre-drain select line voltage to drain select lines of the selected memory block and unselected memory blocks.

According to an aspect of the present disclosure, there is provided a method of operating a semiconductor memory device, the method including: applying a program voltage to word lines of a selected memory block among a plurality of memory blocks; performing a verify operation by applying a verify voltage to the plurality of memory blocks included in a memory cell array; and upon completion of the verify operation, applying a pre-drain select line voltage to drain select lines of the selected memory block and unselected memory blocks, thereby initializing potential levels of channels of memory strings included in the selected memory block and the unselected memory blocks.

BRIEF DESCRIPTION OF THE DRAWINGS

Example embodiments will now be described more fully hereinafter with reference to the accompanying drawings in which.

DETAILED DESCRIPTION

Figure 1:
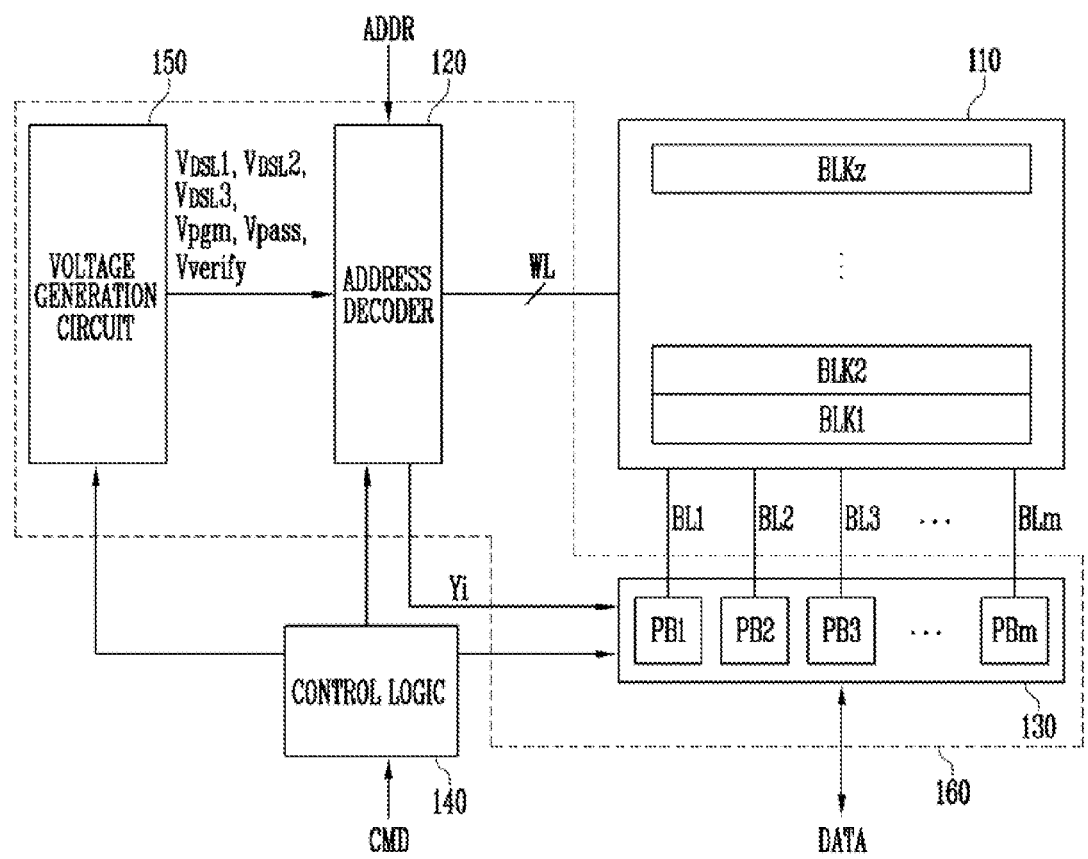
FIG. 1 is a block diagram illustrating a semiconductor memory device according to an embodiment of the present invention.

In the following detailed description, various embodiments of the present invention have been described, simply by way of illustration. As those skilled in the art would realize, the described embodiments may be modified in various different ways, without departing from the spirit or scope of the present invention. Accordingly, the drawings and description are to be regarded as illustrative in nature and not restrictive. The present invention may be embodied in different forms and should not be construed as being limited to the embodiments set forth herein. Rather, these embodiments are provided so that this disclosure will be thorough and complete, and will fully convey the present invention to those skilled in the art to which this invention pertains.

The drawings are not necessarily to scale and, in some instances, proportions may have been exaggerated to more clearly illustrate the elements of the various embodiments of the present invention. For example, in the drawings, the size of elements, dimensions and intervals between elements may be exaggerated compared to actual sizes and intervals for clarity of illustration.

It will be understood that when an element is referred to as being "between" two elements, it can be the only element between the two elements, or one or more intervening elements may also be present. Like reference numerals refer to like elements throughout.

In the entire specification, when an element is referred to as being "connected" or "coupled" to another element, it can be directly connected or coupled to the another element or be indirectly connected or coupled to the another element with one or more intervening elements interposed therebetween.

The terminology used herein is for the purpose of describing particular embodiments only and is not intended to be limiting of the present invention.

As used herein, singular forms are intended to include the plural forms as well, unless the context clearly indicates otherwise.

It will be further understood that the terms "comprises", "comprising", "includes", and "including" when used in this specification, specify the presence of the stated elements and do not preclude the presence or addition of one or more other elements.

As used herein, the term "and/or" includes any and all combinations of one or more of the associated listed items.

Unless otherwise defined, all terms including technical and scientific terms used herein have the same meaning as commonly understood by one of ordinary skill in the art to which the present invention pertains in view of the present invention. It will be further understood that terms, such as those defined in commonly used dictionaries, should be interpreted as having a meaning that is consistent with their meaning in the context of the present invention and the relevant art and will not be interpreted in an idealized or overly formal sense unless expressly so defined herein.

In the following description, numerous specific details are set forth for providing a thorough understanding of the present invention. The present invention may be practiced without some or all of these specific details. In other instances, well-known process structures and/or processes have not been described in detail in order not to unnecessarily obscure the present invention with well-known features or processes.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

FIG. 1 is a block diagram illustrating a semiconductor memory device 100, according to an embodiment of the present invention.

Referring to FIG. 1, the semiconductor memory device 100 includes a memory cell array 110, an address decoder 120, a read/write circuit 130, a control logic 140, and a voltage generation circuit 150. The address decoder 120, the read/write circuit 130, and the voltage generation circuit 150 may be defined as a peripheral circuit 160 for performing various operations including a program operation on the memory cell array 110.

The memory cell array 110 includes a plurality of memory blocks BLK1 to BLKz. The plurality of memory blocks BLK1 to BLKz are coupled to the address decoder 120 through a plurality of word lines WL. The plurality of memory blocks BLK1 to BLKz are coupled to the read/write circuit 130 through a plurality of bit lines BL1 to BLm. Each of the plurality of memory blocks BLK1 to BLKz includes a plurality of memory cells. In an embodiment, the plurality of memory cells may be nonvolatile memory cells. Among the plurality of memory cells, a plurality of memory cells commonly coupled to one word line may be defined as one page. Therefore, the memory cell array 110 may be configured to include a plurality of pages.

Each of the plurality of memory blocks BLK1 to BLKz in the memory cell array 110 includes a plurality of memory strings. Each of the plurality of memory strings includes a drain select transistor, a plurality of memory cells, and a source select transistor, which are coupled in series between a bit line and a source line. Each of the plurality of memory strings may include a pass transistor between the source select transistor and the memory cells and a pass transistor between the drain select transistor and the memory cells. Each of the plurality of memory strings may further include a pipe gate transistor between the memory cells. A more detailed example of the memory cell array 110 is described later with reference to FIGS. 2 and 3.

The address decoder 120 is coupled to the memory cell array 110 through the plurality of word lines WL. The address decoder 120 is configured to operate in response to control of the control logic 140. The address decoder 120 receives an address ADDR through an input/output buffer (not shown) inside the semiconductor memory device 100.

In a program operation, the address decoder 120 decodes a row address in the received address ADDR, and applies, to a plurality of memory cells and a drain select transistor in the memory cell array 110, a plurality of operation voltages, which are generated from the voltage generation circuit 150, according to the decoded row address. For example, the plurality of operation voltages includes a program voltage Vpgm, a verify voltage Vverify, a pass voltage Vpass, and a plurality of drain select line voltages $V_{DSL}1$, $V_{DSL}2$, and $V_{DSL}3$.

In the program operation, the address decoder 120 is configured to also decode a column address in the received address ADDR. The address decoder 120 transmits the decoded column address Yi to the read/write circuit 130.

In the program operation, the address decoder 120 is configured to also decode a block address in the received address ADDR.

Hence, the received address ADDR in the program operation includes a block address, a row address, and a column address. The address decoder 120 selects one memory block and one word line (i.e., one page of the memory block) according to the block address and the row address. The column address is decoded by the address decoder 120 to be provided to the read/write circuit 130.

The address decoder 120 may include a block decoder, a row decoder, a column decoder, an address buffer, and the like.

The read/write circuit 130 includes a plurality of page buffers PB1 to PBm. The plurality of page buffers PB1 to PBm are coupled to the memory cell array 110 through the bit lines BL1 to BLm. The plurality of page buffers PB1 to PBm respectively control potentials of corresponding bit lines BL1 to BLm according to data DATA to be programmed in a program voltage applying operation during the program operation. Also, the plurality of page buffers PB1 to PBm respectively sense potential levels or current amounts of the corresponding bit lines BL1 to BLm in a program: verify operation, thereby performing a verify operation.

The read/write circuit 130 operates in response to control of the control logic 140.

As an exemplary embodiment, the read/write circuit 130 may include page buffers (or page registers), a column select circuit, and the like.

The control logic 140 is coupled to the address decoder 120, the read/write circuit 130, and the voltage generation circuit 150. The control logic 140 receives a command CMD through the input/output buffer (not shown) inside the semiconductor memory device 100. The control logic 140 is configured to control the general operations of the semiconductor memory device 100 in response to the command CMD.

The control logic 140 controls the address decoder 120, the read/write circuit 130, and the voltage generation circuit 150 to perform a pre-drain select line voltage applying operation before the program voltage applying operation is performed after the program verify operation is completed during the program operation. More specifically, the control logic 140 controls the voltage generation circuit 150 to generate a drain select line voltage (e.g., $V_{DSL}3$) for a predetermined time in the pre-drain select line voltage applying operation, and controls the address decoder 120 to apply the drain select line voltage (e.g., $V_{DSL}3$) to the plurality of memory blocks BLK1 to BLKz included in the memory cell array 110. Also, the control logic 140 controls the read/write circuit 130 to apply a ground voltage Vss to the bit lines BL1 to BLm in the pre-drain select line voltage applying operation.

Thus, although potential levels of channels of a plurality of memory strings included in unselected memory blocks among the plurality of memory blocks BLK1 to BLKz are decreased to negative potential levels by a discharge operation of word lines after the program verify operation, the potential levels of the channels of the plurality of memory strings can be again increased to ground potential levels in a section (or period) of the pre-drain select line voltage applying operation before the program voltage applying operation. Accordingly, it is possible to prevent a program disturbance phenomenon of unselected memory strings included in the unselected memory blocks.

The voltage generation circuit 150 generates a plurality of operation voltages including a program voltage Vpgm, a pass voltage Vpass, a verify voltage Vverify, and a plurality of drain select line voltages $V_{DSL}1$, $V_{DSL}2$, and $V_{DSL}3$ under control of the control logic 140 in the program operation, and outputs the generated operation voltages to the address decoder 120.

Figure 2:
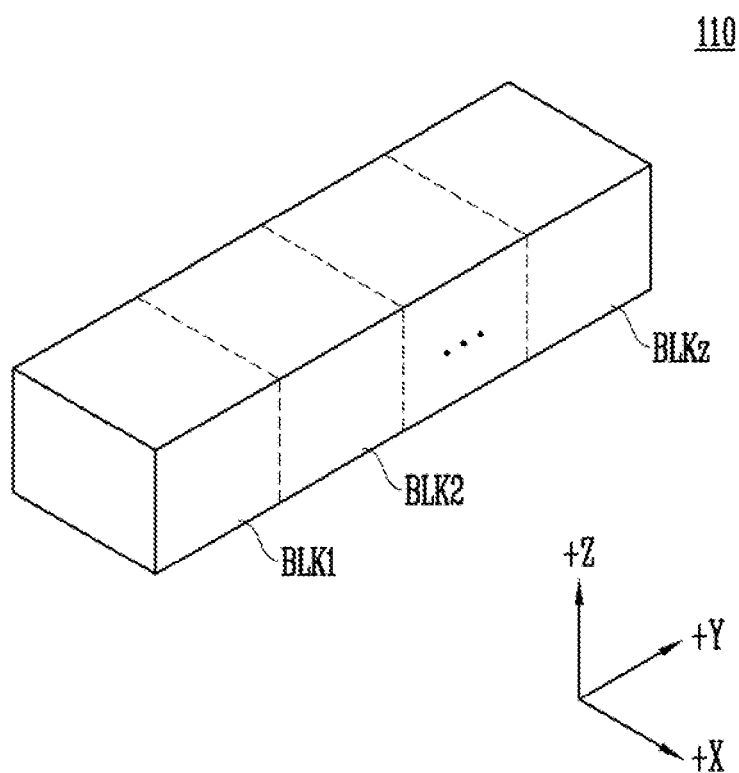
FIG. 2 is a diagram illustrating an example of a memory cell array of FIG. 1.

FIG. 2 is a diagram illustrating an example of the memory cell array 110 of FIG. 1.

Referring to FIG. 2, the memory cell array 110 includes a plurality of memory blocks BLK1 to BLKz. Each memory block has a three-dimensional structure. Each memory block includes a plurality of memory cells stacked over a substrate. The plurality of memory cells are arranged along +X, +Y, and +Z directions. A structure of each memory block will be described in detail with reference to FIG. 3.

Figure 3:
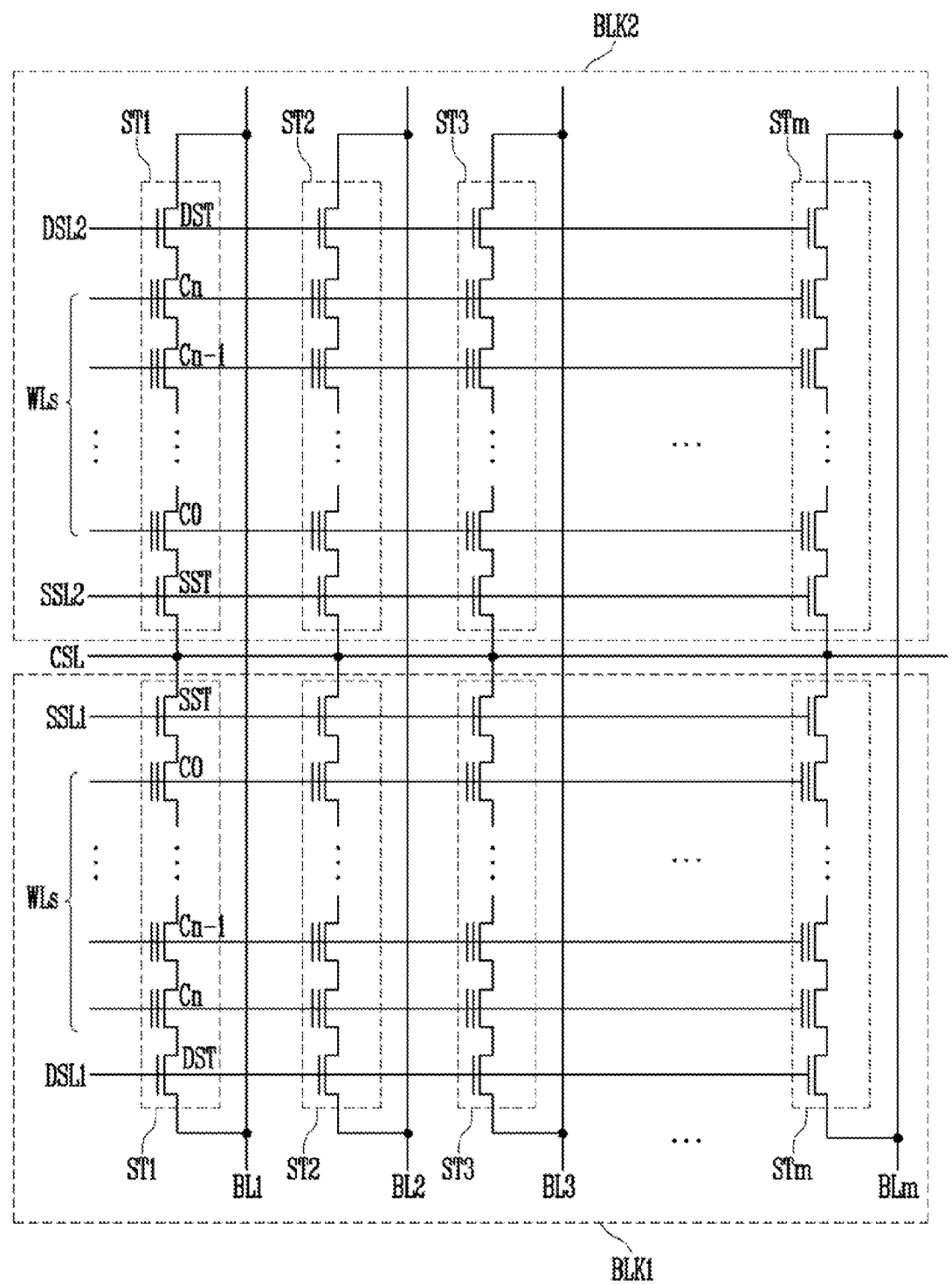
FIG. 3 is a circuit diagram illustrating memory blocks of FIG. 1.

FIG. 3 is a circuit diagram illustrating the memory blocks of FIG. 1.

Although, a plurality of memory blocks BLK1 to BLKz as shown in FIG. 1 are coupled to the read/write circuit 130 through the bit lines BL1 to BLm, only memory blocks BLK1 and BLK2 are representatively shown in FIG. 3 for convenience of illustration and description.

Referring to FIG. 3, the memory blocks BLK1 and BLK2 are coupled to the plurality of bit lines BL1 to BLm.

The memory block BLK1 includes a plurality of memory strings ST1 to STm. Each of the plurality of the memory strings ST1 to STm is coupled between a respective bit line among the plurality of bit lines BL1 to BLm and a common source line CSL, respectively. For example, memory string ST1 is coupled between bit line BL1 and the common source line CSL, memory string ST2 is coupled between bit line BL2 and the common source line and so on and so forth with the last string STm coupled to the last bit line BLm. Each of the plurality of memory strings ST1 to STm includes a source select transistor SST, a plurality of memory cells C0 to Cn coupled in series, and a drain select transistor DST. The source select transistor SST is coupled to a source select line SSL1. The plurality of memory cells C0 to Cn are coupled to word lines WLs, respectively. The drain select transistor DST is coupled to a drain select line DSL1. The common source line CSL is coupled to a source of the source select transistor SST. Each of the bit lines BL1 to BLm is coupled to a drain of a corresponding drain select transistor DST.

The memory block BLK2 may be configured into a similar structure to the memory block BLK1. That is, the memory block BLK2 includes a plurality of memory strings ST1 to STm, and the plurality of memory strings ST1 to STm are coupled between the plurality of bit lines BL1 to BLm and the common source line CSL, respectively. Each of the plurality of memory strings ST1 to STm includes a source select transistor SST, a plurality of memory cells C0 to Cn coupled in series, and a drain select transistor DST. The source select transistor SST is coupled to a source select line SSL2. The plurality of memory cells C0 to Cn are coupled to word lines WLs, respectively. The drain select transistor DST is coupled to a drain select line DSL2. The common source line CSL is coupled to a source of the source select transistor SST. Each of the bit lines BL1 to BLm is coupled to a drain of a corresponding drain select transistor DST.

As described above, the memory blocks BLK1 and BLK2 are configured into structures similar to each other, and the drain select lines DSL1 and DSL2 respectively coupled to the drain select transistors DST may be designed to be electrically separated from each other.

Figure 4:
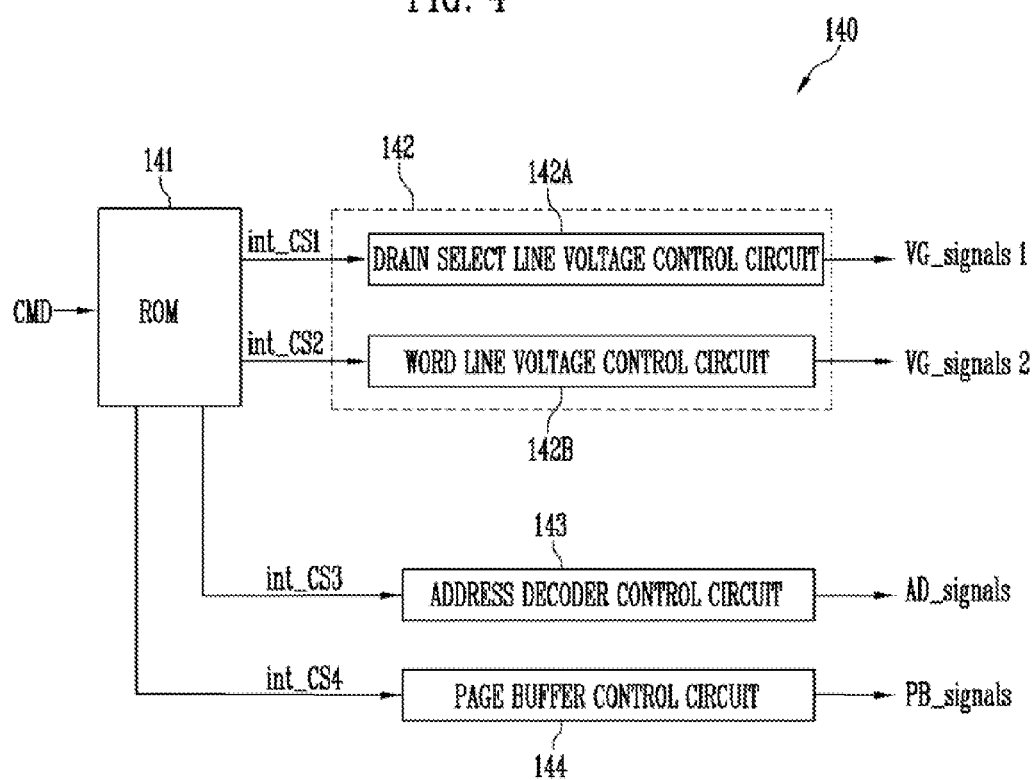
FIG. 4 is a block diagram illustrating an example of the control logic of FIG. 1.

FIG. 4 is a block diagram illustrating an example of the control logic 140 of FIG. 1.

Referring to FIG. 4, the control logic 140 may include a read only memory (ROM) 141, a voltage generation control circuit 142, an address decoder control circuit 143, and a page buffer control circuit 144.

The ROM 141 stores an algorithm for performing the general operations of the semiconductor memory device 100, and generates a plurality of internal control signals int_CS1 to int_CS4 in response to a command CMD input received from an external device, e.g., a host coupled to the semiconductor memory device 100.

The voltage generation control circuit 142 includes a drain select line voltage control circuit 142A and a word line voltage control circuit 142B. The drain select line voltage control circuit 142A generates first voltage generation circuit control signals VG_signals 1 for controlling the voltage generation circuit 150 of FIG. 1 to generate drain select line voltages $V_{DSL}1$ and $V_{DSL}2$ applied to a selected memory block and a drain select line voltage $V_{DSL}3$ applied to an unselected memory block in a program operation of the semiconductor memory device 100 in response to an internal control signal int_CS1. The word line voltage control circuit 142B generates second voltage generation circuit control signals VG_signals 2 for controlling the voltage generation circuit 150 of FIG. 1 to generate a program voltage Vpgm and a pass voltage Vpass, applied to the selected memory block and the unselected memory block in the program operation of the semiconductor memory device 100 in response to an internal control signal int_CS2.

The address decoder control circuit 143 outputs address decoder control signals AD_signals for controlling the address decoder 120 of FIG. 1 in a general operation of the semiconductor memory device 100 in response to an internal control signal int_CS3.

The page buffer control circuit 144 outputs page buffer control signals PB_signals for controlling the read/write circuit 130 of FIG. 1 in the general operation of the semiconductor memory device 100 in response to an internal control signal int_CS4.

Figure 5:
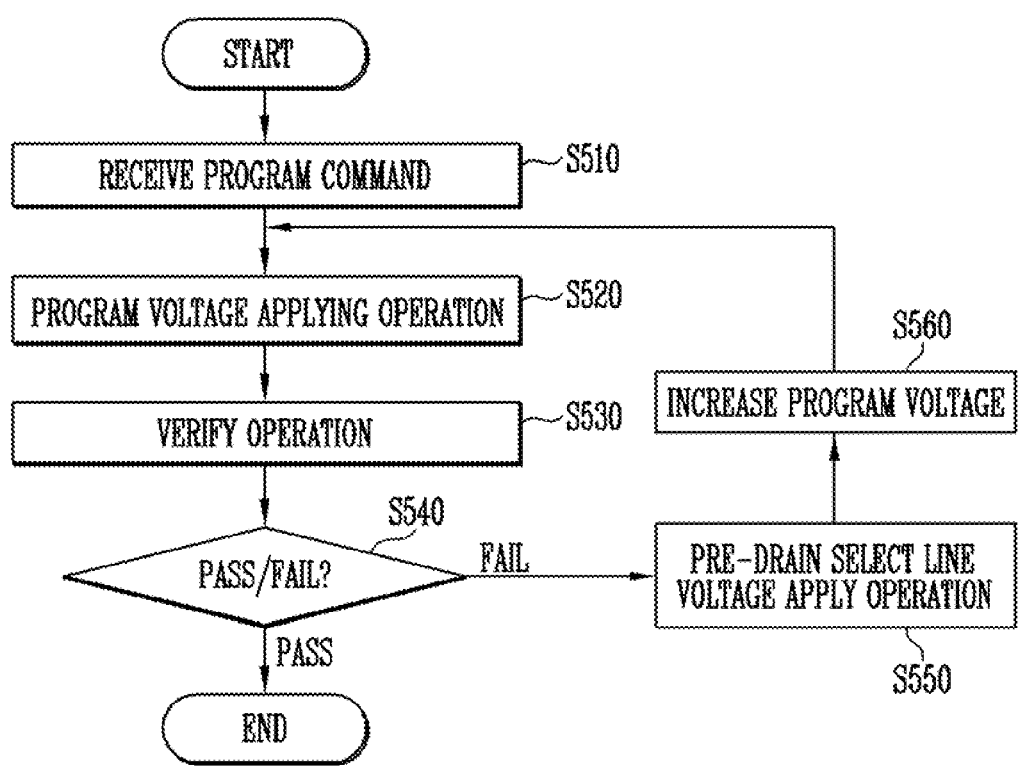
FIG. 5 is a flowchart illustrating an operating method of a semiconductor memory device, according to an embodiment of the present invention.

FIG. 5 is a flowchart illustrating an operating method of a semiconductor memory device according to an embodiment of the present invention.

Figure 6:
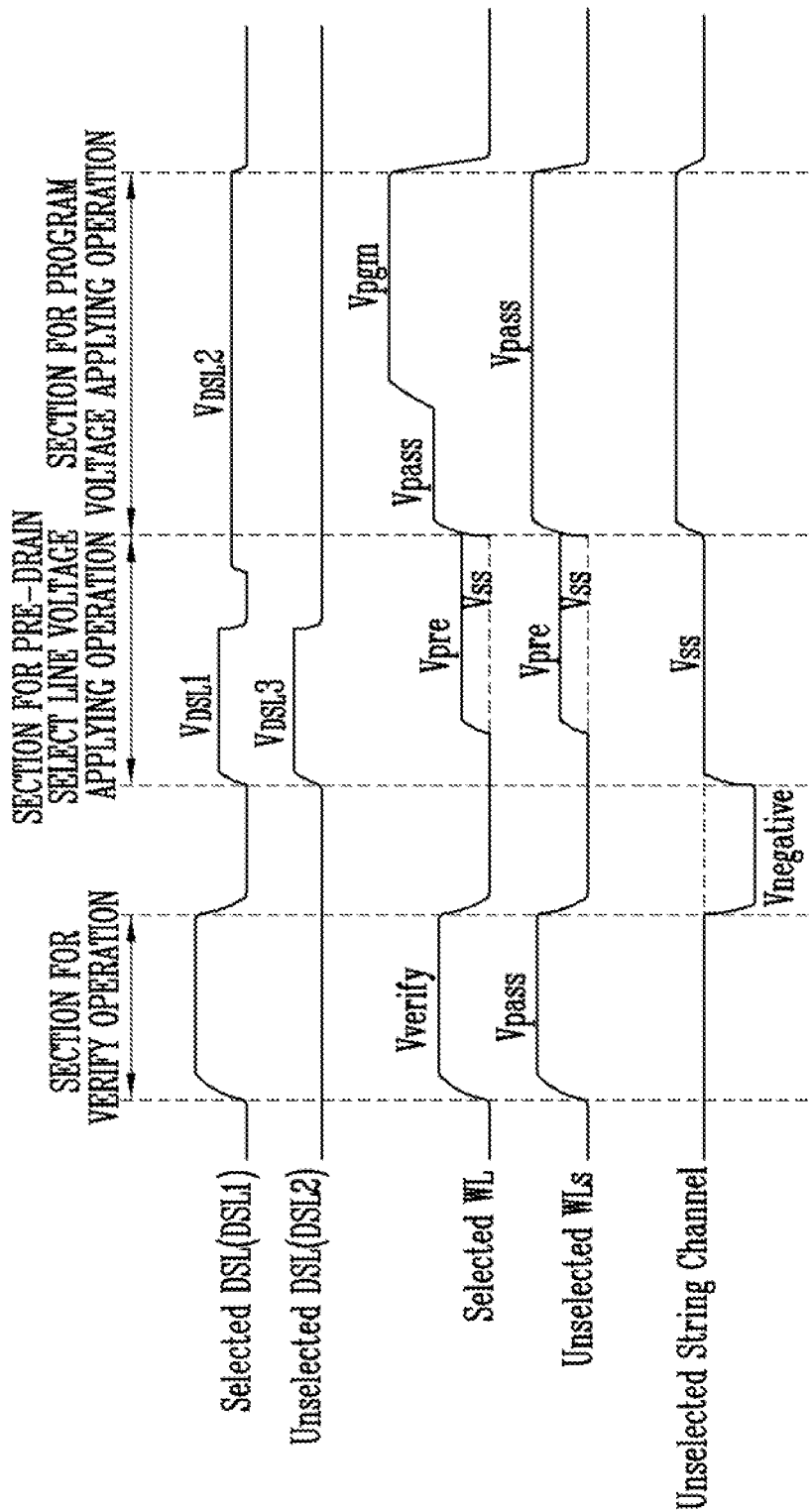
FIG. 6 is a voltage waveform diagram illustrating an operating method of a semiconductor memory device, according to an embodiment of the present invention.

FIG. 6 is a voltage waveform diagram illustrating an operating method of a semiconductor memory device, according to the embodiment of the present invention.

An operation of the semiconductor memory device, according to an embodiment of the present invention, will be described as follows with reference to FIGS. 1 to 6.

In the embodiment of the present invention, a case where a program operation is performed by selecting the memory block BLK1 among the plurality of memory blocks BLK1 to BLKz will be described as an example. That is, the case will be described by respectively defining the memory blocks BLK1 and BLK2 as a selected memory block and an unselected memory block.

If a command CMD for a program command is received from the host which is coupled to the semiconductor memory device 100 of FIG. 1 (S510), the control logic 140 controls the peripheral circuit 160 to perform a program voltage applying operation (S520) of the semiconductor memory device 100.

First, the ROM 141 of the control logic 140 outputs a plurality of internal control signals int_CS1 to int_CS4 in response to the command CMD.

The page buffer control circuit 144 outputs page buffer control signals PB_signals in response to an internal control signal int_CS4. The read/write circuit 130 temporarily stores program data DATA in response to the page buffer control signals PB_signals and then adjusts potential levels of the bit lines BL1 to BLm according to the program data DATA.

The voltage generation control circuit 142 outputs first voltage generation circuit control signals VG_signals 1 and second voltage generation circuit control signals VG_signals 2 in response to internal control signals int_CS1 and int_CS2, respectively. The voltage generation circuit 150 generates and outputs a program voltage Vpgm and a pass voltage Vpass in response to the second voltage generation circuit control signals VG_signals 2. Also, the voltage generation circuit 150 generates a drain, select line voltage $V_{DSL}2$ to be applied to the drain select line DSL1 of the selected memory block BLK1 in response to the first voltage generation circuit control signals VG_signals 1.

The address decoder control circuit 143 outputs address decoder control signals AD_signals in response to an internal control signal int_CS3. The address decoder 120 applies the program voltage Vpgm to a selected word line of the selected memory block BLK1 in response to the address decoder control signals AD_signals, and applies the pass voltage Vpass to unselected word lines of the selected memory block BLK1 in response to the address decoder control signals AD_signals. At this time, a drain select line voltage $V_{DSL2}$ for turning on the drain select transistor DST is applied to the drain select line DSL1 of the selected memory block BLK1.

If the program voltage applying operation (S520) is completed, a verify operation (S530) is performed on the selected memory block BLK1.

The voltage generation control circuit 142 outputs the first voltage generation circuit control signals VG_signals 1 and the second voltage generation circuit control signals VG_signals 2 in response to the internal control signals int_CS1 and int_CS2, respectively. The voltage generation circuit 150 generates and outputs a verify voltage Vverify and the pass voltage Vpass in response to the second voltage generation circuit control signals VG_signals 2.

The address decoder control circuit 143 outputs the address decoder control signals AD_signals in response to the internal control signal int_CS3. The address decoder 120 applies the verify voltage Vverify to the selected word line of the selected memory block BLK1 in response to the address decoder control signals AD_signals, and applies the pass voltage Vpass to the unselected word lines of the selected memory block BLK1 in response to the address decoder control signals AD_signals. At this time, the verify voltage Vverify and the pass voltage Vpass may be applied to the unselected memory block BLK2. However, the drain select transistors DST of the unselected memory block BLK2 are maintained in a turn-off state, and hence the plurality of memory strings ST1 to STm included in the unselected memory block BLK2 are electrically isolated from the bit lines BL1 to BLm.

The page buffer control circuit 144 outputs the page buffer control signals PB_signals in response to the internal control signal int_CS4. The read/write circuit 130 determines whether the program operation of the selected memory block BLK1 has passed or failed in response to the page buffer control signals PB_signals (S540).

If it is determined as a result of the verify operation that the program operation has passed, the program operation is ended. If it is determined as a result of the verify operation that the program operation has failed, a pre-drain select line voltage applying operation is performed (S550).

If the verify voltage Vverify and the pass voltage Vpass, applied to the word lines, are discharged upon completion of the verify operation, potential levels of unselected string channels of the memory strings ST1 to STm included in the unselected memory block BLK2 may be decreased to a negative potential level Vnegative. This results in a program disturbance phenomenon in a subsequent program: voltage applying operation. Thus, the pre-drain select line voltage applying operation is performed (S550), thereby increasing (S560) the potential levels of the unselected string channels of the memory strings ST1 to STm included in the unselected memory block BLK2.

More specifically, the drain select line voltage control circuit 142A of the voltage generation control circuit 142 generates the first voltage generation circuit control signals VG_signals 1 in response to the internal control signal int_CS1. The voltage generation circuit 150 generates and outputs, in response to the first voltage generation circuit control signals VG_signals 1, a drain select line voltage $V_{DSL}1$ to be applied to a selected DSL (DSL1) of the selected memory block BLK1 and a drain select line voltage $V_{DSL}3$ to be applied to an unselected DSL (DSL2) of the unselected memory block BLK2.

The address decoder 120 applies the drain select line voltage $V_{DSL}1$ to the drain select line DSL1 of the selected memory block BLK1, and applies the drain select line voltage $V_{DSL}3$ to the drain select line DSL2 of the unselected memory block BLK2. Therefore, the memory strings ST1 to STm of the selected memory block BLK1 and the memory strings ST1 to STm of the unselected memory block BLK2 are electrically coupled to the bit lines BL1 to BLm. In this case, the read/write circuit 130 may apply a ground voltage Vss or a power voltage greater than the ground voltage Vss to the bit lines BL1 to BLm. Accordingly, the power level of the channels of the memory strings ST1 to STm of the unselected memory block BLK2 can be precharged to the ground voltage Vss or the power voltage greater than the ground voltage Vss. When voltages applied to the selected WL and the unselected WLs in the pre-drain select line voltage applying operation is decreased to the ground voltage Vss lower than a pre-voltage Vpre, the power level of the channels of the memory strings ST1 to STm of the unselected memory block BLK2 can be further increased according to the potential levels of the bit lines BL1 to BLm.

After that, the control logic 140 newly sets a program voltage Vpgm to be increased by a step voltage as compared with the program voltage Vpgm used in a previous program voltage applying operation S(S550-S560).

After that, the operating method is re-performed from the above-described program voltage applying operation (S520) using the newly set program voltage Vpgm.

As described above, in the embodiment of the present invention, the drain select line voltage $V_{DSL}3$ is applied such that the bit lines BL1 to BLm and the memory strings ST1 to STm of the unselected memory block BLK2 are electrically coupled to the drain select line DSL2 of the unselected memory block BLK2 in the pre-drain select line voltage applying operation upon completion of the verify operation. Thus, the potential levels of the unselected string channels of the memory strings ST1 to STm included in the unselected memory block BLK2 is increased from the negative potential level Vnegative to the ground voltage Vss or the power voltage greater than the ground voltage Vss. Accordingly, it is possible to prevent a program disturbance phenomenon that may occur in the unselected memory block BLK2 in a subsequent program voltage applying operation.

Figure 7:
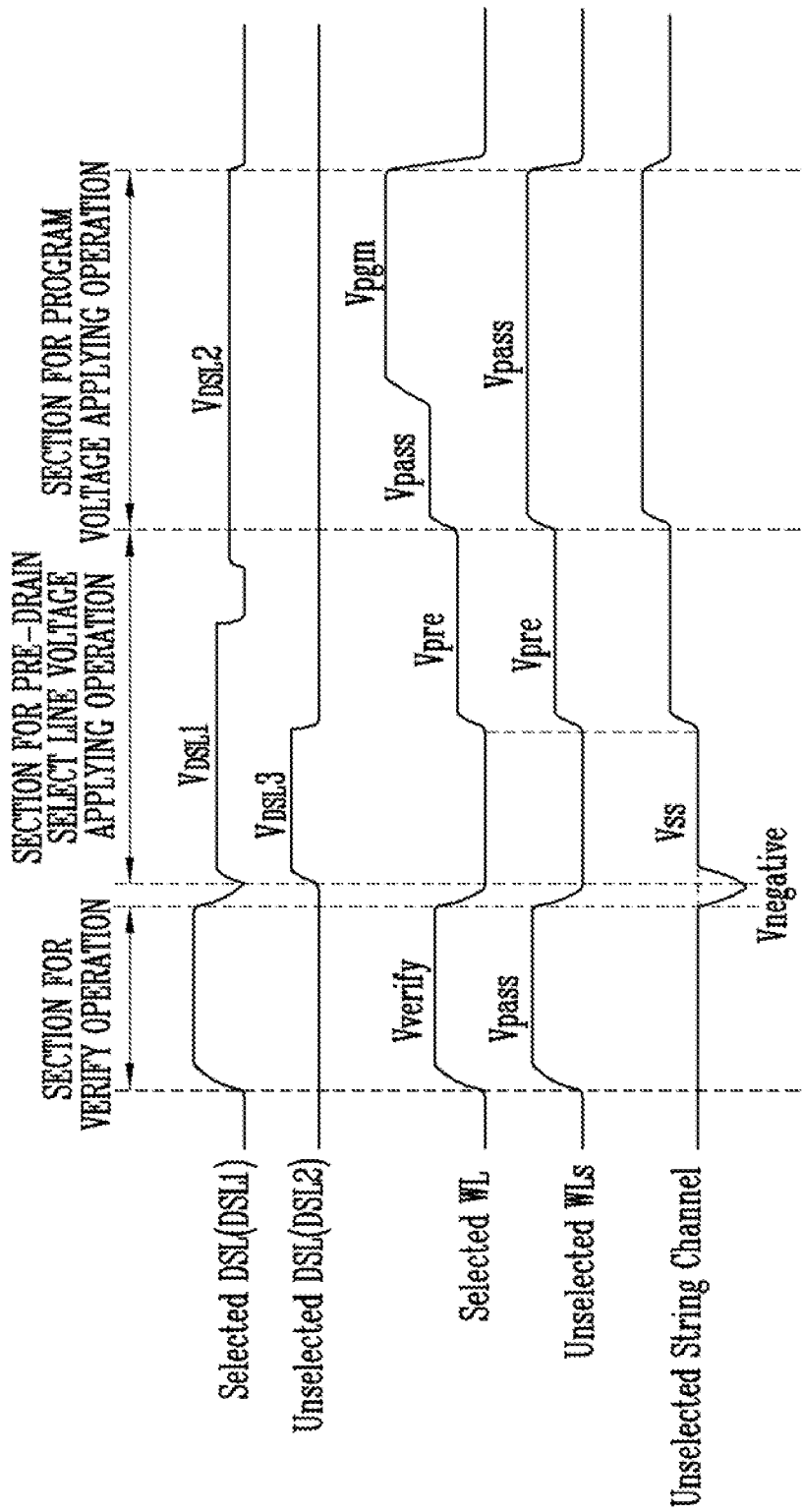
FIG. 7 is a voltage waveform diagram illustrating an operating method of a semiconductor memory device according to another embodiment of the present invention.

FIG. 7 is a voltage waveform diagram illustrating an operating method of a memory device, according to another embodiment of the present invention.

Referring to FIGS. 1 and 7, just after the verify voltage Vverify is discharged as the verify operation (S530) described with reference to FIG. 5 is completed, the drain select line voltage $V_{DSL}1$ is applied to the drain select line DSL1 of the selected memory block BLK1, and the drain select line voltage $V_{DSL}3$ is applied to the drain select line DSL2 of the unselected memory block BLK2. At this time, the read/write circuit 130 discharges the potential levels of the bit lines BL1 to BLm, so that the potential levels of the unselected string channels of the memory strings ST1 to STm included in the unselected memory block BLK2 can be initialized from the negative potential level Vnegative to the ground voltage Vss. When the memory strings ST1 to STm include pass transistors and a pipe transistor, a turn-on operation voltage may be preferably applied to gates of the pass transistors and the pipe transistor.

Figure 8:
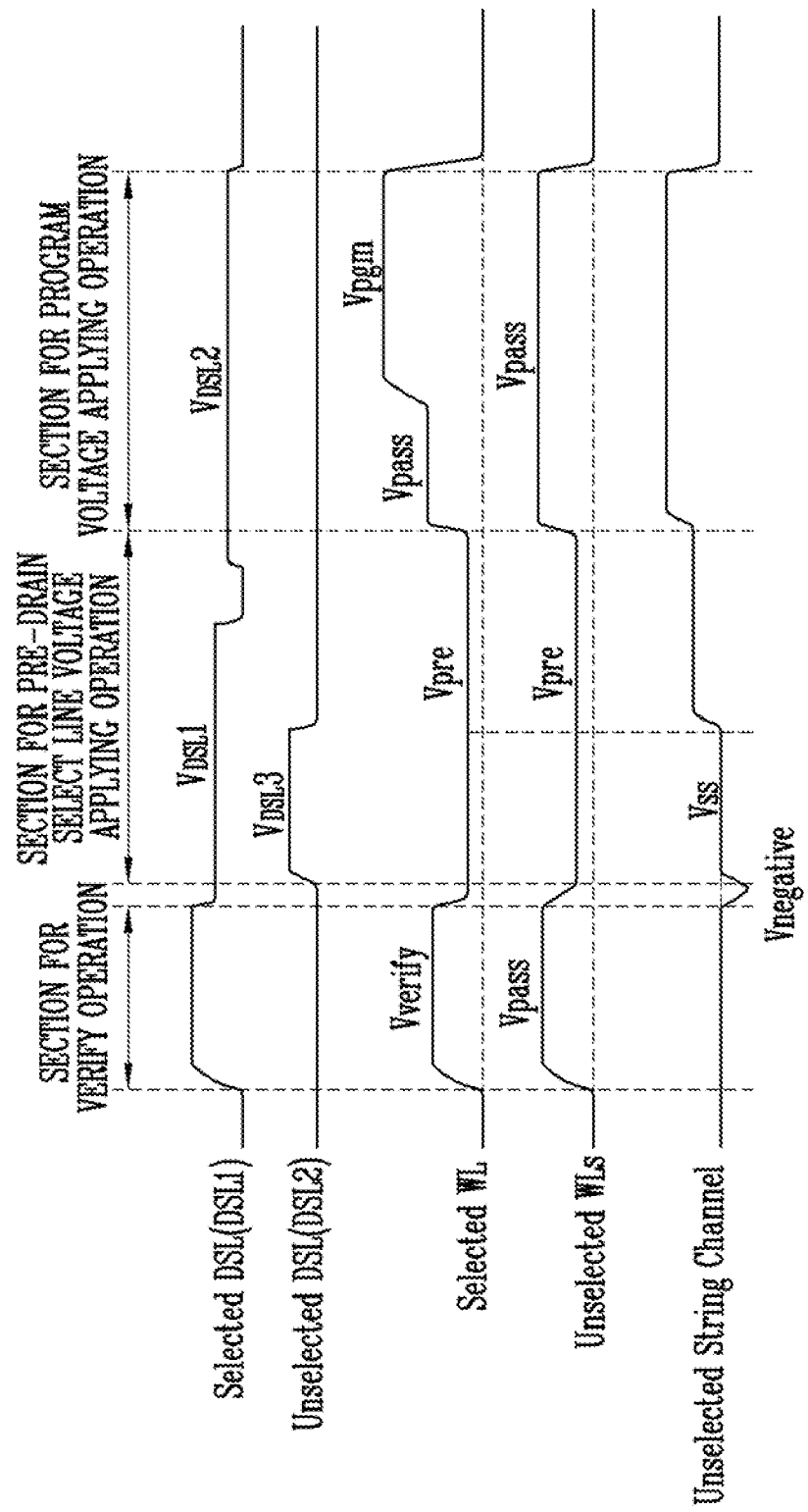
FIG. 8 is a voltage waveform diagram illustrating an operating method of a semiconductor memory device according to still another embodiment of the present invention.

FIG. 8 is a voltage waveform diagram illustrating an operating method of a memory device, according to still another embodiment of the present invention.

Referring to FIGS. 1 and 8, when the verify voltage Vverify and the pass voltage Vpass are discharged as the verify operation (S530) described with reference to FIG. 5 is completed, the verify voltage Vverify and the pass voltage Vpass are not discharged to the level of the ground voltage Vss but discharged to the pre-voltage Vpre having a potential level greater than the ground voltage Vss, so that it is possible to decrease a potential level where the potential levels of the unselected string channels of the memory strings ST1 to STm included in the unselected memory block BLK2 is decreased. In addition, just after the verify voltage Vverify and the pass voltage Vpass are discharged to the pre-voltage Vpre, the drain select line voltage $V_{DSL}1$ is applied to the drain select line DSL1 of the selected memory block BLK1, and the drain select line voltage $V_{DSL}3$ is applied to the drain select line DSL2 of the unselected memory block BLK2. Accordingly, the potential levels of the unselected string channels of the memory strings ST1 to STm included in the unselected memory block BLK2 can be initialized from the negative potential level Vnegative to the ground voltage Vss.

Figure 9:
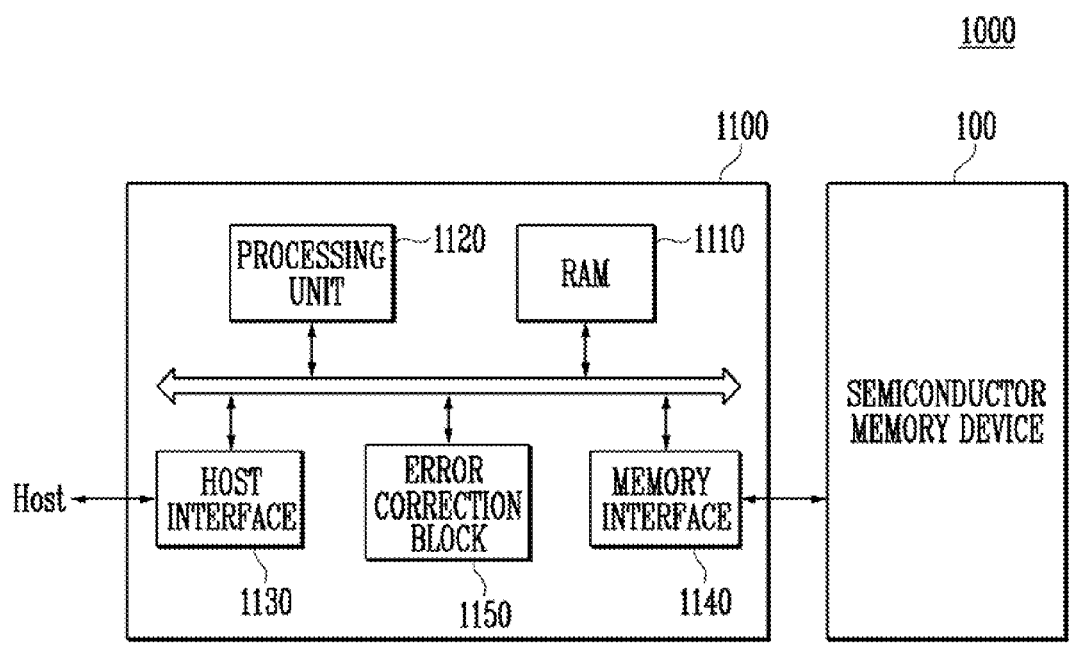
FIG. 9 is a block diagram illustrating a memory system including the semiconductor memory device of FIG. 1.

FIG. 9 is a block diagram illustrating a memory system 1000 including the semiconductor memory device 100 of FIG. 1.

Referring to FIG. 9, the memory system 1000 includes a semiconductor memory device 100 and a controller 1100.

The semiconductor memory device 100 may be configured and operated identically to the semiconductor memory device described with reference to FIG. 1. Hereinafter, overlapping descriptions will be omitted.

The controller 1100 is coupled to a host Host and the semiconductor memory device 100. The controller 1100 is configured to access the semiconductor memory device 100 in response to a request from the host Host. For example, the controller 1100 is configured to control read, write, erase, and background operations of the semiconductor memory device 100. The controller 1100 is configured to provide an interface between the semiconductor memory device 100 and the host Host. The controller 1100 is configured to drive firmware for controlling the semiconductor memory device 100.

The controller 1100 includes a random access memory (RAM) 1110, a processing unit 1120, a host interface 1130, a memory interface 1140, an error correction block 1150 all coupled via an internal bus. The RAM 1110 is used as at least one of an operation memory of the processing unit 1120, a cache memory between the semiconductor memory device 100 and the host Host, and a buffer memory between the semiconductor memory device 100 and the host Host. The controller 1100 may arbitrarily store program data provided from the host Host in a write operation.

The processing unit 1120 controls the general operations of the controller 1100. Any suitable processing unit may be employed.

The host interface 1130 includes a protocol for exchanging data between the host Host and the controller 1100. For example, the controller 1100 may be configured to communicate with the host Host through at least one of various interface protocols, such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The memory interface 1140 interfaces the controller with the semiconductor memory device 100. For example, the memory interface 1140 may include a NAND interface or a NOR interface.

The error correction block 1150 is configured to detect and correct errors in the data received from the semiconductor memory device 100, for example, by using an error correction code (ECC). Any suitable error correction code may be employed. For example, the processing unit 1120 may control the semiconductor memory device 100 to adjust a read voltage, based on an error detection result of the error correction block 1150, and to perform re-reading. In the illustrated embodiment, the error correction block 1150 is provided as a component of the controller 1100.

The controller 1100 and the semiconductor memory device 100 may be integrated into one semiconductor device. As an exemplary embodiment, the controller 1100 and the semiconductor memory device 100 may be integrated into one semiconductor device, to constitute a memory card. For example, the controller 1100 and the semiconductor memory device 100 may be integrated into one semiconductor device, to constitute a memory card such as a PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or a universal flash storage (UFS).

The controller 1100 and the semiconductor memory device 100 may be integrated into one semiconductor device to constitute a semiconductor drive (or solid state drive (SSD)). The semiconductor drive SSD includes a storage device configured to store data in a semiconductor memory. If the memory system 1000 is used as the semiconductor drive SSD, the operating speed of the host Host coupled to the memory system 1000 can be remarkably improved.

As another example, the memory system 1000 may be provided as one of various components of an electronic device such as a computer, an ultra-mobile PC (UMPC), a workstation, a net-book, a personal digital assistant (PDA), a portable computer, a web tablet, a wireless phone, a mobile phone, a smart phone, an e-book, a portable multimedia player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

As an exemplary embodiment, the semiconductor memory device 100 or the memory system 1000 may be packaged in various forms. For example, the semiconductor memory device 100 or the memory system 1000 may be packaged as a package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi chip package (MCP), wafer-level fabricated package (WFP), or wafer-level processed stack package (WSP).

Figure 10:
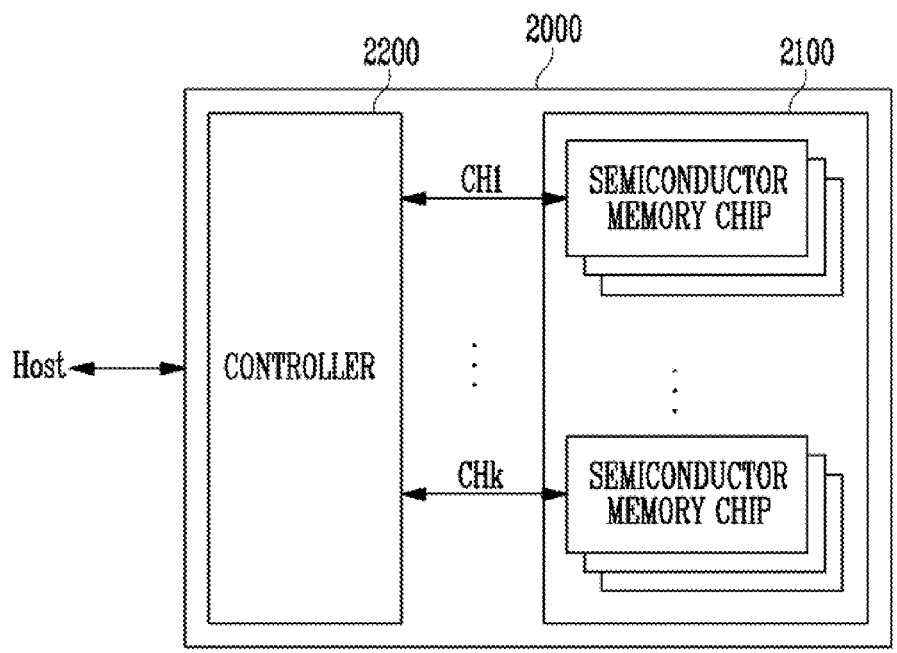
FIG. 10 is a block diagram illustrating an application example of the memory system of FIG. 9, according to an embodiment of the present invention.

FIG. 10 is a block diagram illustrating an application example 2000 of the memory system 1000 of FIG. 9 according to an embodiment of the invention.

Referring to FIG. 10, the memory system 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 10, it is illustrated that the plurality of groups communicate with the controller 2200 through first to kth channels CH1 to CHk. Each semiconductor memory chip may be configured and operated identically to the semiconductor memory device 100 described with reference to FIG. 1.

Each group is configured to communicate with the controller 2200 through one common channel. The controller 2200 is configured similarly to the controller 1100 described with reference to FIG. 8. The controller 2200 is configured to control the plurality of memory chips of the semiconductor memory device 2100 through the plurality of channels CH1 to CHk.

Figure 11:
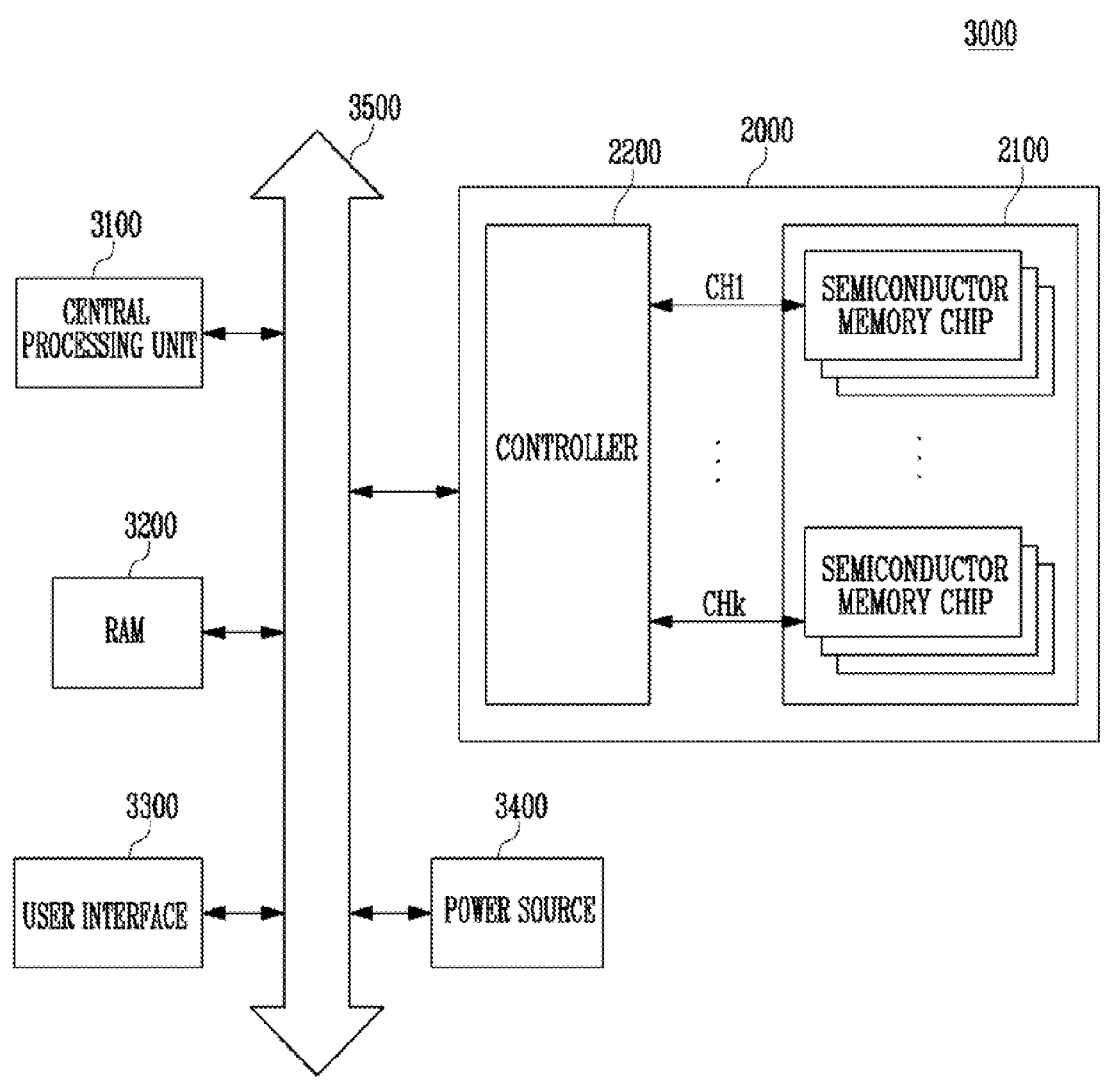
FIG. 11 is a block diagram illustrating a computing system including the memory system described with reference to FIG. 10, according to an embodiment of the present invention.

FIG. 11 is a block diagram illustrating a computing system 3000 including the memory system 2000 described with reference to FIG. 10, according to an embodiment of the present invention.

Referring to FIG. 11, the computing system 300 includes a central processing unit 3100, a random access memory (RAM) 3200, a user interface 3300, a power source 3400, a system bus 3500, and a memory system 2000.

The memory system 2000 is electrically coupled to the central processing unit 3100, the RAM 3200, the user interface 3300, and the power source 3400 through the system bus 3500. Data supplied through the user interface 3300 or data processed by the central processing unit 3100 are stored in the memory system 2000.

In FIG. 11, it is illustrated that the semiconductor memory device 2100 is coupled to the system bus 3500 through the controller 2200. However, the semiconductor memory device 2100 may be directly coupled to the system bus 3500. In this case, the functions of the controller 2200 may be performed by the central processing unit 3100 and the RAM 3200.

As illustrated in FIG. 11, the memory system 2000 may be the memory system 200 described with reference to FIG. 10. However, in another embodiment, the memory system 2000 may be replaced by the memory system 1000 described with reference to FIG. 9. In yet another embodiment, the computing system 3000 may be configured to include both the memory systems 1000 and 2000 described with reference to FIGS. 9 and 10.

According to the present invention, a memory system and an operation method thereof are provided that are capable of preventing a program disturbance phenomenon occurring in unselected memory strings during a program operation of a semiconductor memory device of the memory system.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in the form and details may be made without departing from the spirit and scope of the present invention as set forth in the following claims.

What is claimed is:

1. A semiconductor memory device comprising:
a memory cell array including a plurality of memory blocks;
a peripheral circuit configured to perform a program operation on a selected memory block among the plurality of memory blocks; and
a control logic configured to control the peripheral circuit to perform the program operation,
wherein the control logic controls the peripheral circuit to sequentially apply a program voltage to a selected word line, apply a verify voltage to the selected word line for a verify operation, apply a pre-drain select line voltage to drain select lines of the selected memory block and unselected memory blocks, and apply a next program voltage to the selected word line.

2. The semiconductor memory device of claim 1, wherein the peripheral circuit includes:
a voltage generation circuit configured to generate operation voltages including at least one of the pre-drain select line voltage, the program voltage, the next program voltage, the verify voltage, and a pass voltage;
an address decoder configured to transmit the operation voltages to the plurality of memory blocks; and
a read/write circuit coupled to bit lines of the memory cell array, the read/write circuit being configured to adjust potential levels of the bit lines or sense potential levels or current amounts of the bit lines in the program operation.

3. The semiconductor memory device of claim 2, wherein the voltage generation circuit:
in the verify operation, generates the verify voltage and the pass voltage, and
upon completion of the verify operation, discharges the verify voltage and the pass voltage and then generates the pre-drain select line voltage.

4. The semiconductor memory device of claim 3, wherein, upon completion of the verify operation, the voltage generation circuit discharges the verify voltage and the pass voltage to at least one of a ground voltage or a pre-voltage greater than the ground voltage.

5. The semiconductor memory device of claim 3, wherein, upon completion of the verify operation, the address decoder applies the pre-drain select line voltage to the drain select lines of the selected memory block and the unselected memory blocks.

6. The semiconductor memory device of claim 2, wherein, when the pre-drain select line voltage is applied to the drain select lines of the selected memory block and the unselected memory blocks upon completion of the verify operation, the read/write circuit applies at least one of a ground voltage or a voltage greater than the ground voltage to the bit lines.

7. The semiconductor memory device of claim 2, wherein a plurality of memory strings included in the unselected memory blocks are electrically coupled to the bit lines by the pre-drain select line voltage.

8. The semiconductor memory device of claim 7, wherein potential levels of channels of the plurality of memory strings are initialized to a ground voltage or a potential level greater than the ground voltage by the voltage levels of the bit lines.

9. The semiconductor memory device of claim 2, wherein the control logic includes:
a read only memory configured to store an algorithm and output a plurality of internal control signals according to the algorithm in response to an input command;
a voltage generation control circuit configured to generate a voltage generation circuit control signal for controlling the voltage generation circuit in response to at least one of the plurality of internal control signals;
an address decoder control circuit configured to generate an address decoder control signal for controlling the address decoder in response to any one of the plurality of internal control signals; and
a page buffer control circuit configured to generate a page buffer control signal for controlling the read/write circuit in response to any one of the plurality of internal control signals.

10. A method for operating a semiconductor memory device, the method comprising:
applying a program voltage to a selected word line of a selected memory block among a plurality of memory blocks included in a memory cell array;
performing a verify operation by applying a verify voltage to the selected word line of the selected memory block;
applying a pre-drain select line voltage to drain select lines of the selected memory block and unselected memory blocks; and
applying a next program voltage to the selected word line.

11. The method of claim 10, wherein the applying of the pre-drain select line voltage comprises applying at least one of a ground voltage or a pre-voltage greater than the ground voltage to a plurality of bit lines commonly coupled to the plurality of memory blocks.

12. The method of claim 10, wherein the verify operation and the applying of the pre-drain select line voltage are re-performed after the next program voltage is applied to the selected word line.

13. The method of claim 10, wherein the verify voltage is discharged to at least one of a ground voltage or a pre-voltage greater than the ground voltage.

14. The method of claim 10, wherein the performing of the verify operation comprises applying a pass voltage to unselected word lines of the selected memory block and the unselected memory blocks, and when the verify voltage is discharged, the pass voltage is also discharged.

15. The method of claim 11, wherein, after the verify voltage is discharge, memory strings of the selected memory block and the unselected memory blocks are electrically coupled to the bit lines by the pre-drain select line voltage, and the memory strings of the unselected memory blocks are initialized to at least one level of the ground voltage or the pre-voltage according to potential levels of the bit lines.

16. A method for operating a semiconductor memory device, the method comprising:

applying a program voltage to a selected word line of a selected memory block among a plurality of memory blocks included in a memory cell array;

performing a verify operation by applying a verify voltage to the selected word line of the selected memory block;

applying a pre-drain select line voltage to drain select lines of the selected memory block and unselected memory blocks, thereby initializing potential levels of channels of memory strings included in the selected memory block and the unselected memory block; and applying a next program voltage to the selected word line.

17. The method of claim 16, wherein the applying of the pre-drain select line voltage comprises applying at least one of a ground voltage or a pre-voltage greater than the ground voltage to a plurality of bit lines commonly coupled to the plurality of memory blocks.

18. The method of claim 16, wherein the pre-drain select line voltage is applied after the selected word line is discharged.

19. The method of claim 18, wherein the selected word line is discharged to a ground voltage or a pre-voltage greater than the ground voltage.

20. The method of claim 16, wherein, when the pre-drain select line voltage is applied, at least one of a ground voltage or a pre-voltage greater than the ground voltage is applied to word lines of the selected memory block and the unselected memory blocks.

* * * * *